United States Patent [19]

Inoue et al.

[11] Patent Number: 5,181,040
[45] Date of Patent: Jan. 19, 1993

[54] METHOD OF MEASURING THE NULL ANGLE OF A MONOPULSE ANTENNA AND APPARATUS THEREFOR

[75] Inventors: Masato Inoue; Minoru Tajima; Nobutake Orime; Takashi Katagi, all of Kanagawa, Japan

[73] Assignee: Mitsubishi Denki Kabushiki Kaisha, Japan

[21] Appl. No.: 601,264

[22] Filed: Oct. 22, 1990

[30] Foreign Application Priority Data

Dec. 13, 1989 [JP] Japan ................... 1-323441

[51] Int. Cl.⁵ .................. G01S 13/44; G01S 7/36
[52] U.S. Cl. ...................... 342/149; 342/154; 342/157; 342/158; 342/152
[58] Field of Search ............... 342/149, 152, 154, 157, 342/158

[56] References Cited

U.S. PATENT DOCUMENTS

| | | | |
|---|---|---|---|
| 3,683,381 | 8/1972 | Strenglein | 342/169 |
| 3,772,695 | 11/1973 | Hoffman | 342/77 |
| 4,134,113 | 1/1979 | Powell | 342/25 |
| 4,296,415 | 10/1981 | Pelton et al. | 342/94 |
| 4,331,958 | 5/1982 | Lacomme | 342/152 |
| 4,517,570 | 5/1985 | Gray, Jr. | 342/372 |
| 4,549,183 | 10/1985 | Farina | 342/17 |
| 4,568,940 | 2/1986 | Diamond | 342/149 |
| 4,599,622 | 7/1986 | Hampt | 342/427 |
| 4,719,464 | 1/1988 | Gendreu | 342/149 |
| 5,017,929 | 5/1991 | Tsuda | 342/427 |

FOREIGN PATENT DOCUMENTS 57-93267 6/1982 Japan.

Primary Examiner—John B. Sotomayor
Attorney, Agent, or Firm—Wolf, Greenfield & Sacks

[57] ABSTRACT

A method of and an apparatus for measuring the null angle in the difference vs. sum pattern and in the difference pattern of a monopulse antenna. The null angle of the monopulse antenna in the radiation pattern is acquired by transmitting an RF signal from a plurality of antenna elements to the monopulse antenna, acquiring the sum signal and difference signals in the directions of the respective antenna elements and acquiring the null angle in accordance with the sum and difference signals. The apparatus comprises a rotator for changing the direction of the monopulse antenna and a transmitting antenna facing the monopulse antenna for transmitting a test signal to the monopulse antenna.

18 Claims, 6 Drawing Sheets

METHOD OF MEASURING THE NULL ANGLE OF A MONOPULSE ANTENNA AND APPARATUS THEREFOR

BACKGROUND OF THE INVENTION

1. Field of the Invention

The present invention relates to a method of measuring an angular direction of null ("null angle") in a radiation pattern of a monopulse antenna, and an apparatus therefor.

2. Prior Art

FIGS. 1a-1c show a method according to a prior art which is adapted to measure the null angle of a monopulse antenna in a difference pattern. In these figures, the reference numeral 100a designates an aperture of a monopulse antenna 100; and 100b a mechanical boresight axis of the monopulse antenna. The monopulse antenna 100 is supported by a mechanical means rotatable in the horizontal plane. On the other hand, a transmission antenna is so arranged that the maximum value in its radiation pattern $E_t$ is oriented toward the aperture center of the monopulse antenna 100.

As the monopulse antenna 100 is rotated in the horizontal plane, a reception level in the difference pattern of the monopulse antenna 100 will vary as indicated by the arrows in FIGS. 1a-1c. Thus, the null angle $\delta$ in the difference pattern can be measured by serially detecting the amplitudes of difference signals $\dot{E}_\Delta$ output from the difference signal output terminal of the monopulse antenna 100 as a function of rotational angles $\theta_1$, $\theta_2$ and $\theta_3$ of the monopulse antenna 100.

More specifically, the absolute value of the difference signal output becomes minimum in the angular direction $\delta$ and, then, the angle $\delta$ can be understood as indicating the null angle.

A sum signal $\dot{E}_\Sigma$ output at a sum signal output terminal of the monopulse antenna 100 can also be measured in the same manner as described above. By dividing the difference signal $\dot{E}_\Delta$ by the sum signal $\dot{E}_\Sigma$, the null angle of the difference signal vs. sum signal pattern can be specified.

A rotational angle of the monopulse antenna 100 can normally be detected by a synchronous signal from a synchronous transmitter or a digital signal from a shaft encoder provided on a rotary apparatus, for example, a rotator of the monopulse antenna 100.

It is to be noted, however, that the degree of accuracy in measuring the null angle depends largely on mechanical parameters such as the degree of accuracy in positioning a rotator and the repeatability of a rotational angle and the like. Furthermore, setting a rotator to a predetermined angle results in further time being taken to carry out a measurement. It has been found out that the prior art method is not suitable for conducting measurements, with a high degree of accuracy, the null angle in the radiation pattern of an antenna adapted to perform a minute beam scanning such as an electrically scanning monopulse antenna.

SUMMARY OF THE INVENTION

Accordingly, a general object of the present invention is to solve the problems as mentioned above.

An object of the present invention is to provide a method of measuring an angular direction of null ("null angle") in a radiation pattern of a monopulse antenna at high speed and with a high degree of accuracy, and an apparatus therefor.

A further object of the present invention is to provide a method of measuring an angular direction of null in the difference signal vs. sum signal pattern and in the difference pattern of a monopulse antenna at a high speed and with a high degree of accuracy, and an apparatus therefor.

In order to attain these objects, the present invention provides a method of measuring an angular direction of null in a radiation pattern of a monopulse antenna, comprising the steps of:

transmitting a predetermined RF signal from an array antenna including a plurality of antenna elements having a predetermined phase relationship to the monopulse antenna;

receiving the RF signal at the monopulse antenna;

acquiring sum and difference signals which the monopulse antenna produces in each direction of the respective antenna elements; and obtaining the null angle in a radiation pattern of the monopulse antenna in accordance with the acquired sum and difference signals.

An embodiment of the present invention is to provide a method of measuring the null angle in the difference signal vs. sum signal pattern of a monopulse antenna, comprising the steps of:

transmitting a predetermined RF signal from an array antenna including a plurality of antenna elements having a predetermined phase relationship to the monopulse antenna;

receiving the RF signal at the monopulse antenna;

acquiring difference and sum signals which the monopulse antenna produces in each direction of the respective antenna elements;

computing a ratio of the difference signal to the sum signal acquired in each of the directions of the respective antenna elements; and obtaining the null angle in the difference signal vs. sum signal pattern of the monopulse antenna in accordance with the computed ratios.

The array antenna may include phase shifters respectively connected to the antenna elements and a controller adapted to set desired amounts of phase shift in the phase shifters. In order to transmit a predetermined RF signal from the array antenna and acquire sum and difference signal outputs from the monopulse antenna, an amount of phase shift set in each phase shifter may be adjusted in turn from the first to the last phase shifters and an RF signal is transmitted from the array antenna each time the amount of phase shift is changed.

The RF signal thus transmitted is received by the monopulse antenna, and the difference signal output from the monopulse antenna is acquired in each of the directions of the respective antenna elements.

A second RF signal is transmitted from the array antenna.

This second RF signal is received so that the sum signal may be acquired from the monopulse antenna in each of the directions of the respective element antennas.

In order to obtain the null angle of the monopulse antenna, the ratios calculated above are subjected to interpolation so that a continuous difference signal/sum signal pattern is obtained.

Another embodiment of the present invention is to provide a method of measuring the null angle in the difference pattern of a monopulse antenna.

This method comprises the steps of:

transmitting an RF signal from an array antenna including a plurality of antenna elements having a predetermined phase relationship to the monopulse antenna;

changing the direction of the monopulse antenna in sequence so that it faces the respective antenna elements, and receiving the RF signal every time the direction of the monopulse antenna is switched;

acquiring values of the radiation fields which the respective antenna elements form and the difference signals which the monopulse antenna produces in each direction of the respective antenna elements; and obtaining the ratios of the acquired difference signals to the corresponding radiation fields thereby obtaining the null angle in the difference pattern of the monopulse antenna in accordance with the thus obtained ratios.

In the case where the radiation fields of the antenna elements are obtained, the sum signal of the monopulse antenna is acquired in each of the directions of the respective antenna elements every time the boresight axis of the monopulse antenna is oriented toward any one of the antenna elements. Relative values of the radiation fields of the respective antenna elements are acquired based on the acquired sum signals and these relative values are stored for use in calibration.

It is only necessary to divide the difference signal by the corresponding calibration value for each of the directions of the antenna elements so as to obtain the ratio described above.

Also in this embodiment, in order to obtain the null angle, the obtained ratios may be subjected to an interpolation process to obtain the consecutive difference pattern.

The present invention also provides an apparatus for measuring the null angle in a radiation pattern of a monopulse antenna, comprising:

means connected to the monopulse antenna to alter the direction of the monopulse antenna;

a transmission antenna including a plurality of antenna elements arranged in a specified configuration so as to face the monopulse antenna and adapted to transmit test signals, and which is capable of altering the phases of the test signals transmitted from the respective antenna elements; and a signal processing means adapted to receive the sum signals and difference signals output from the monopulse antenna and acquire the null angle by processing these output signals.

The transmission antenna may be a phased array antenna including a plurality of antenna elements which are linearly arranged, phase shifters connected to the respective antenna elements and a controller for causing desired amounts of phase shift to be set in the respective phase shifters.

The means to alter the direction of the monopulse antenna may be a rotator capable of mechanically rotating the monopulse antenna in the direction in which the antenna elements are arranged.

The transmission antenna may alternatively be a phased array antenna including a plurality of antenna elements arranged in a plane, phase shifters connected respectively to the antenna elements and a controller for causing desired amounts of phase shift to be set in the respective phase shifters.

The monopulse antenna employed in the above-mentioned embodiments may have a function of electronically scanning a beam.

According to the present invention, since the null angle in a radiation pattern of a monopulse antenna can be measured without moving the monopulse antenna, the rate and the degree of accuracy of measurement may be improved as compared to a prior art measurement during which a monopulse antenna is mechanically rotated by means of a rotator. Accordingly, even if the direction of the beam from the monopulse antenna to be measured is minutely altered and the null angle direction is changed, the direction of the null angle may be measured at a high speed with a high degree of accuracy.

These and other objects and features of the present invention will become apparent in consideration of the following detailed description in conjunction with the accompanying drawings illustrating some of the preferred embodiments of the present invention.

BRIEF DESCRIPTION OF THE DRAWINGS

FIG. 4 through FIG. 9 illustrate an example of the steps according to the present invention for acquiring a null angle in the difference signal/sum signal pattern of a monopulse antenna, wherein FIG. 4 illustrates difference signals which the monopulse antenna produces in the direction of the respective antenna elements of a phased array antenna when the boresight axis of the monopulse antenna is oriented toward the central antenna element of the phased array antenna, FIG. 5 illustrates a change in a composite vector of the difference signals which the monopulse antenna produces in the directions of the respective antenna elements of the phased array antenna, FIG. 6 is used for explaining the change in the composite vector shown in FIG. 5; FIG. 7 illustrates relative amplitude and relative phase of the difference signals which the monopulse antenna produces in the directions of the respective antenna elements of the phased array antenna relative to the initial composite vector of these difference signals, FIG. 8 illustrates sum signals output from the monopulse antenna, and FIG. 9 illustrates the difference pattern of the monopulse antenna acquired in the steps explained in connection with FIG. 4 through FIG. 8; and FIG. 10 through FIG. 12 illustrate an example of the steps of measuring the null angle in the difference pattern of a monopulse antenna, wherein FIG. 10 illustrates the sum signals which the monopulse antenna produces when the mechanical boresight axis of the monopulse antenna is oriented to the antenna element located at one end of the phased array antenna, FIG. 11 illustrates the sum signals which the monopulse antenna produces when the mechanical boresight axis of the monopulse antenna is oriented toward the second antenna element in the phased array antenna, and FIG. 12 illustrates the sum signals which the monopulse antenna produces when the mechanical boresight axis of the monopulse antenna is oriented toward the antenna element at the other end of the phased array antenna.

DETAILED DESCRIPTION OF THE PREFERRED EMBODIMENTS

Figure 3:
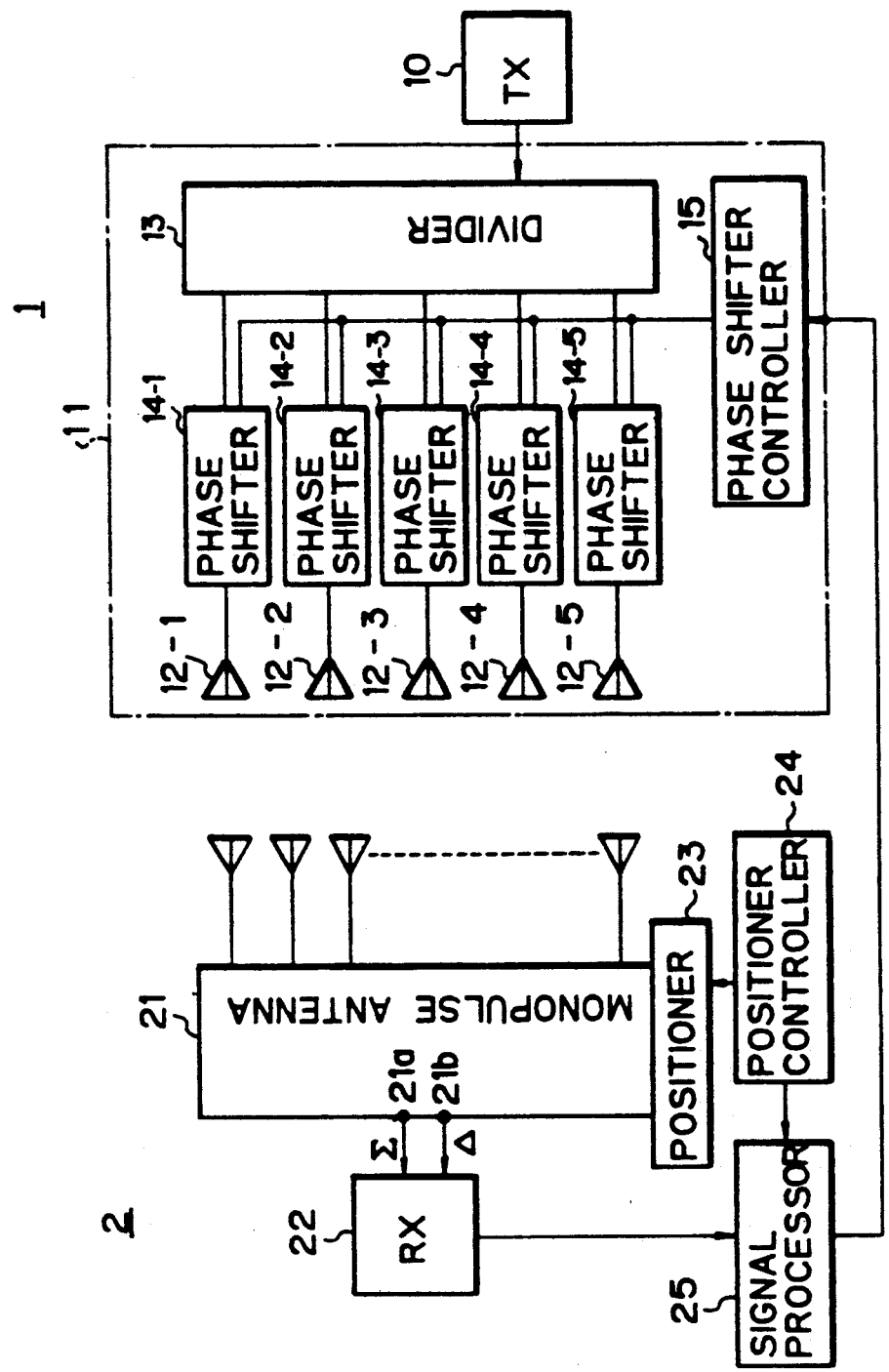
FIG. 3 is a block diagram illustrating an embodiment of an apparatus for measuring the null angle of a monopulse antenna according to the present invention.

FIG. 3 is a block diagram illustrating the constitution of a measuring apparatus according to an embodiment of the present invention. A transmission section 1 adapted to transmit an RF signal comprises a transmitter 10 adapted to generate an RF signal and a phased array antenna unit 11. The phased array antenna unit 11 comprises antenna elements 12-1, 12-2, 12-3, 12-4 and 12-5 forming a phased array antenna; a divider 13 adapted to distribute the RF signal from the transmitter 1 to the respective antenna elements 12-1, 12-2, ..., 12-5; phase shifters 14-1, 14-2, 14-3, 14-4 and 14-5 interposed between the divider 13 and the respective antenna elements 12-1, 12-2, ..., 12-5 and adapted to alter the phase of the electric wave radiated into space from the respective antenna elements 12-1, 12-2, ..., 12-5 and a phase shifter controller 15 adapted to switch the individual phase shifters 14-1, 14-2, ..., 14-5.

It is understood that for the convenience of explanation the number of the elements of the phased array antenna is assumed to be five in this embodiment.

In the meantime, a reception section 2 adapted to receive the electric wave sent from the transmission section 1 comprises a beam scanning monopulse antenna 21 whose characteristics are to be measured; a receiver 22 adapted to receive sum signals and difference signals output from a sum signal output terminal 21a and a difference signal output terminal 21b of the monopulse antenna 21; a positioner 23 adapted to support and rotate the monopulse antenna 21; a positioner controller 24 adapted to control the rotator 23 and a signal processor 25 adapted to compare reception signals from the receiver 22 and angular signals from the positioner controller 24 to acquire the null angle and control the phase shifter controller 15.

An operation will next be explained with reference to FIGS. 4–11.

It is assumed that the null angle direction in the difference pattern of the monopulse antenna 21 forms a minute angle δ relative to the boresight axis 21c. It is also assumed that the antenna elements 12-1–12-5 are arranged linearly at an equal distance d along the beam scanning direction of the monopulse antenna 21, the central element 12-3 being located on the boresight axis 21c of the monopulse antenna 21. The orientation of the monopulse antenna 21 is so set in advance by the positioner 23 that the null angle direction in the difference pattern may be expected to be included within an angle α viewing, from the aperture center of the monopulse antenna, the elements 12-1 and 12-5 positioned at the opposite ends of the phased array antenna. In this embodiment, since the null angle δ is assumed to be minute, the monopulse antenna 21 is so set that the boresight axis 21c is directed to the central element 12-3.

First, an operation for acquiring the null angle in the "difference signal vs. sum signal" pattern is explained. Firstly, a fixed amount of phase is set in the phase shifters 14-1, 14-2, ..., 14-5 respectively connected to the antenna elements 12-1, 12-2, ..., 12-5 of the phased array antenna unit 11 so that each of the antenna elements 12-1, 12-2, ..., 12-5 may be driven at the initial amplitude and phase.

In this condition, a composite electric radiation field of the RF signals emitted from the respective antenna elements 12-1, 12-2, ..., 12-5 is received by the monopulse antenna 21. The monopulse antenna 21 then produces, at the terminal 21b, signals corresponding to the electric fields $\dot{E}_{1D}, \dot{E}_{2D}, \ldots, \dot{E}_{5D}$ (see FIG. 4) received in the direction of the respective antenna elements 12-1, 12-2, ..., 12-5, and expressed as follows:

$$\left. \begin{array}{l} \dot{E}_{1D} = \dot{A}_{1D}\dot{B}_1 \\ \dot{E}_{2D} = \dot{A}_{2D}\dot{B}_2 \\ \dot{E}_{3D} = \dot{A}_{3D}\dot{B}_3 \\ \dot{E}_{4D} = \dot{A}_{4D}\dot{B}_4 \\ \dot{E}_{5D} = \dot{A}_{5D}\dot{B}_5 \end{array} \right\} \quad (1)$$

where $\dot{A}_{1D}, \dot{A}_{2D}, \ldots, \dot{A}_{5D}$ designate the electric fields in the difference pattern which the monopulse antenna 21 produces in angles $\theta_1, \theta_2, \theta_3, \theta_4, \theta_5$ formed between the lines connecting the aperture center and the respective antenna elements 12-1–12-5 and the mechanical boresight axis 21c of the monopulse antenna 21; and $\dot{B}_1, \dot{B}_2, \ldots \dot{B}_5$ designate relative values of the electric radiation fields of the respective antenna elements 12-1–12-5 measured in the directions $\theta_1, \theta_2, \theta_3, \theta_4, \theta_5$. These values may be expressed by the products of (i) the electric radiation fields defined by the shape of the radiation patterns of the respective antenna elements 12-1–12-5 and the angles $\theta_1$–$\theta_5$, (ii) the electric fields excited at the respective antenna elements, and (iii) the electric fields defined by the propagation path length between the respective antenna elements and the aperture center of the monopulse antenna 21.

The angles $\theta_1, \theta_2, \ldots, \theta_5$ with reference to the mechanical boresight axis 21c of the monopulse antenna 21 can be obtained from such physical parameters as the distance R between the monopulse antenna 21 and the phased array antenna unit 11, the mutual distance between the respective antenna elements 12-1–12-5, and the like. According to the example shown in FIG. 3, the central antenna element 12-3 of the phased array antenna is disposed on the mechanical boresight axis 21c of the monopulse antenna 21, and the mutual distance between the respective antenna elements of the transmitting phased array antenna elements is selected as a constant value d. Then, the angles $\theta_1, \theta_2, \ldots, \theta_5$ are expressed as follows:

$$\left. \begin{array}{l} \theta_1 = -\theta_5 = \tan^{-1}\dfrac{2d}{R} \\ \theta_2 = -\theta_4 = \tan^{-1}\dfrac{d}{R} \\ \theta_3 = 0 \end{array} \right\} \quad (2)$$

Figure 5:
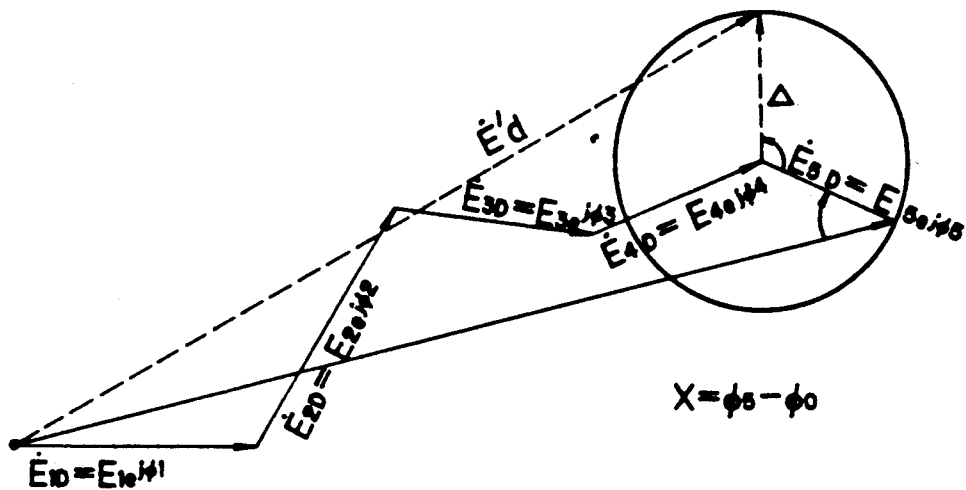
Figure 6:
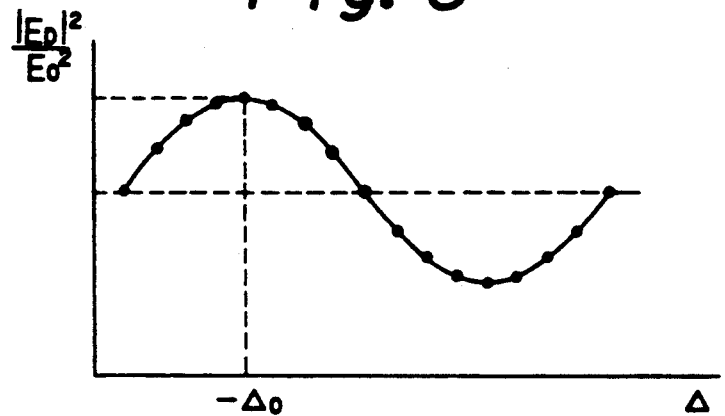
Figure 7:
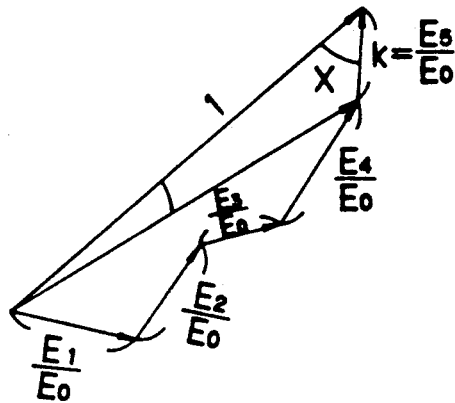

In actuality, a signal equivalent to the product of the composite electric radiation field of the phased array antenna and the difference pattern electric field of the monopulse antenna can be measured at the terminal 21b. As shown in FIG. 5, an electric radiation field vector $E_d$ observed at the difference signal output terminal 21b can be considered as a composite of the products of the electric radiation fields of the respective antenna elements 12-1, 12-2, ..., 12-5 constituting the phased array antenna unit 11 and the difference pattern electric fields which the monopulse antenna 21 receives in the directions of the respective antenna elements, that is, a composite vector of $\dot{E}_{1D}, \dot{E}_{2D}, \ldots, \dot{E}_{5D}$ according to the equation (1). When the phase of a signal exciting any one of the antenna element, for example, the antenna element 12-5 is varied by $\Delta$ from the initial value by changing the state of the phase shifter 14-5, the phase of the electric radiation field $\dot{B}_5$ of the antenna element 12-5 is varied so that the electric field vector $\dot{E}_{5D}$ may be rotated by the amount $\Delta$ and the composite electric field vector $\dot{E}_d$ is correspondingly varied to $\dot{E}_d'$. A relative electric power of the composite electric field vector changes like a cosine signal as shown in FIG. 6. By using a ratio r between the maximum value and the minimum value and the phase $\Delta_o$ at which the maximum value is produced, a relative amplitude k and a relative phase X of the electric field vector $\dot{E}_5$ of the antenna element 12-5 relative to the initial composite electric field vector $\dot{E}_0$ when the phase is varied at the antenna element 12-5 as shown in FIG. 7 can be expressed by the following equation:

$$k = \frac{\Gamma^2}{\sqrt{1 + 2\Gamma \cos\Delta_o + \Gamma^2}} \quad (3)$$

$$X = \tan^{-1}\frac{\sin\Delta_o}{\cos\Delta_o + \Gamma} \quad (4)$$

where $$\Gamma = \frac{r-1}{r+1} \quad (5)$$

This method is called the rotating element electrical field vector method and disclosed in Japanese Patent Public Disclosure No. 93267/82.

Similarly, relative amplitudes and relative phases of the respective antenna elements can be obtained from the equations (3), (4), (5) when relative electric powers of the electric field vectors $\dot{E}_1$, $\dot{E}_2$, $\dot{E}_3$, $\dot{E}_4$ relative to the initial composite electric field vector $\dot{E}_0$ are measured when the phases of the antenna elements 12-1, 12-2, 12-3, 12-4 are varied by using the phase shifters 14-1, 14-2, 14-3, 14-4.

Accordingly, it is possible to obtain the vectors $E_{1D}$, $E_{2D}$, ..., $E_{5D}$ expressed by the equation (1) as the products of the electric radiation fields of the respective antenna elements 12-1–12-5 and the difference pattern electric fields which the monopulse antenna 21 receives in the direction of the respective antenna elements.

Figure 8:
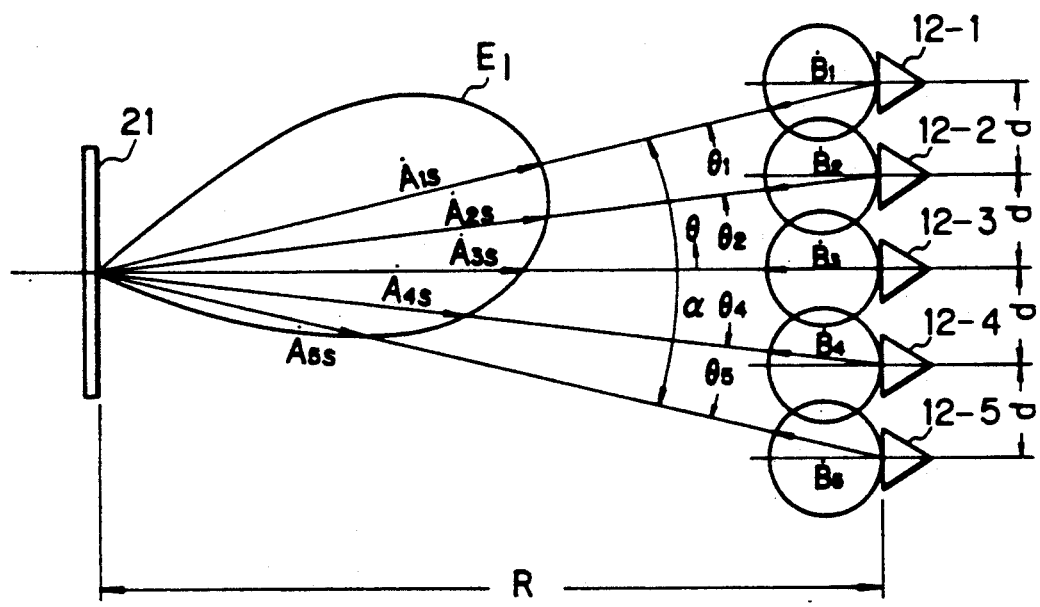

Next, the respective antenna elements are excited again at the initial phase values. Under this condition, a composite electric radiation field of the electric fields radiated from the respective antenna elements 12-1, 12-2, ..., 12-5 are measured at the sum signal output terminal 21a of the monopulse antenna, as shown in FIG. 8. The received electric fields $E_{1S}$, $E_{2S}$, ..., $E_{5S}$ corresponding to the respective antenna elements 12-1, 12-2, ..., 12-5 can be expressed as follows:

$$\left.\begin{array}{l} \dot{E}_{1S} = \dot{A}_{1S}\dot{B}_1 \\ \dot{E}_{2S} = \dot{A}_{2S}\dot{B}_2 \\ \dot{E}_{3S} = \dot{A}_{3S}\dot{B}_3 \\ \dot{E}_{4S} = \dot{A}_{4S}\dot{B}_4 \\ \dot{E}_{5S} = \dot{A}_{5S}\dot{B}_5 \end{array}\right\} \quad (6)$$

Figure 1A:
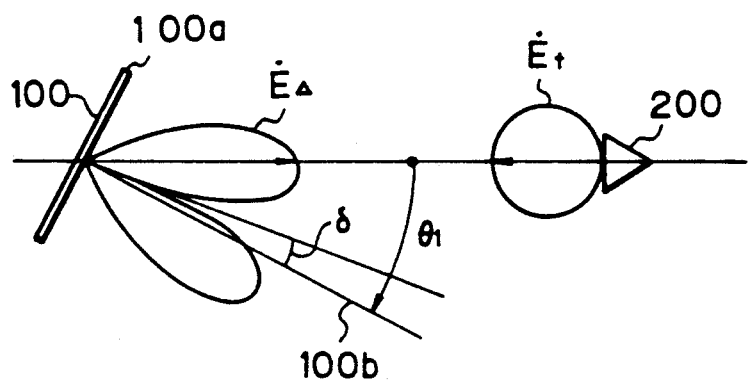
FIGS. 1a-1c illustrate a prior art method of measuring the null angle in a radiation pattern of a monopulse antenna.
Figure 1B:
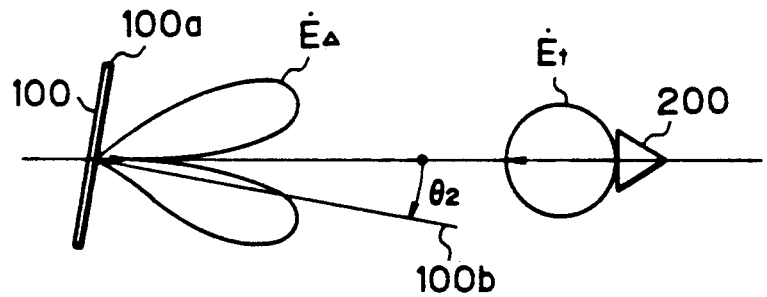
Figure 1C:
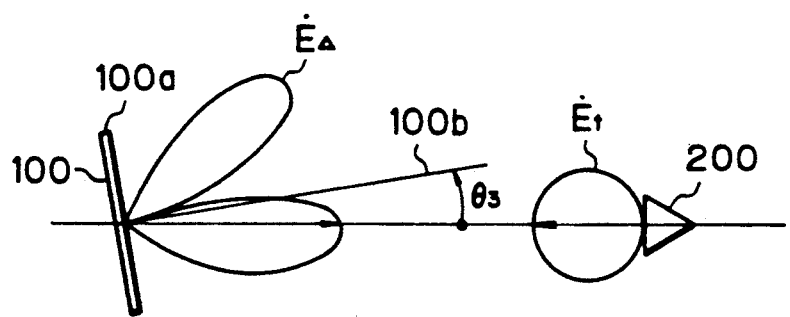
Figure 2:
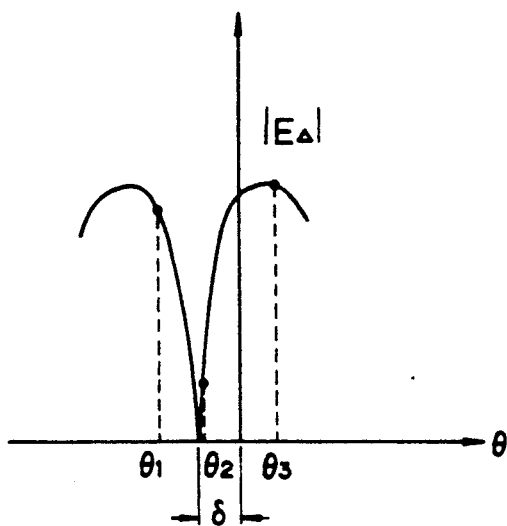
FIG. 2 illustrates the difference pattern of the monopulse antenna as acquired by the method of FIGS. 1a-1c.
Figure 4:
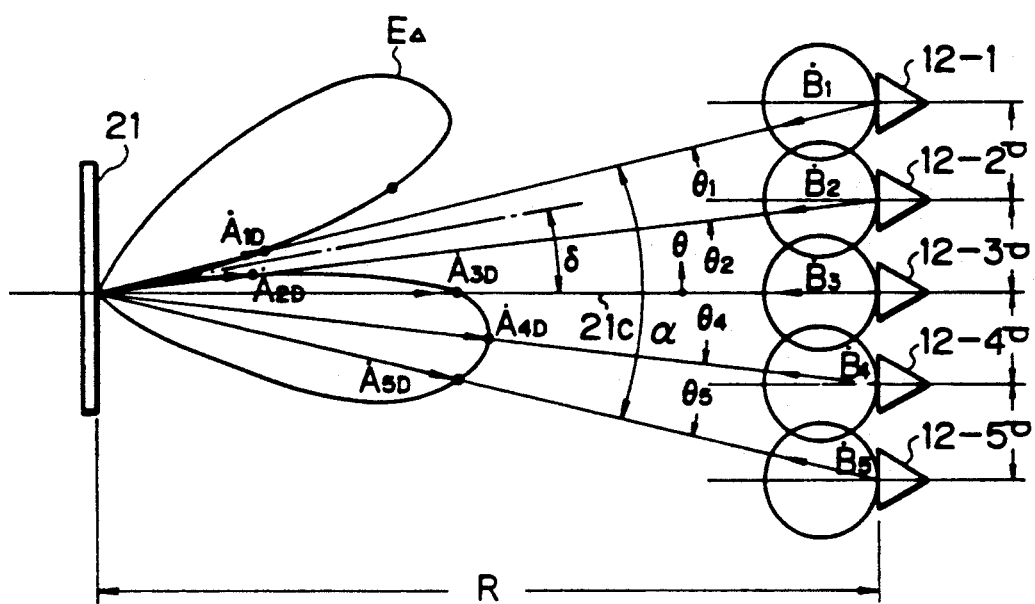

It is to be noted in this connection that $\dot{A}_{1S}$, $\dot{A}_{2S}$, ..., $\dot{A}_{5S}$ are the electric fields in the sum pattern which the monopulse antenna 21 produces in the directions $\theta_1$, $\theta_2$, $\theta_3$, $\theta_4$, $\theta_5$, respectively, as explained in FIG. 4 in regard to the difference signal pattern. $\dot{B}_1$, $\dot{B}_2$, ..., $\dot{B}_5$ designate the electric radiation fields of the respective antenna elements 12-1, 12-2, ..., 12-5, as already defined. By applying the rotating element electrical field vector method as used to obtain $\dot{E}_{1D}$, $\dot{E}_{2D}$, ..., $\dot{E}_{5D}$, one can obtain the vectors $\dot{E}_{1S}$, $\dot{E}_{2S}$, ..., $\dot{E}_{5S}$ expressed by the equation (6) of the products of the electric radiation fields of the respective antenna elements and the electric fields in the sum pattern which the monopulse antenna 21 receives from the respective antenna elements.

By applying the equations (1) and (6), the absolute values $|\dot{E}_\Delta/\dot{E}_\Sigma|$, the ratio of the difference pattern electric field of the monopulse antenna 21 to the sum pattern electric field, can be expressed as follows in the respective directions $\theta_1$, $\theta_2$, ..., $\theta_5$:

$$\left.\begin{array}{l} F(\theta_1) = \left|\frac{\dot{A}_{1S}}{\dot{A}_{1D}}\right| = \left|\frac{\dot{E}_{1D}}{\dot{B}_1}\Big/\frac{\dot{E}_{1S}}{\dot{B}_1}\right| = \left|\frac{\dot{E}_{1D}}{\dot{E}_{1S}}\right| = \frac{|\dot{E}_{1D}|}{|\dot{E}_{1S}|} \\[4pt] F(\theta_2) = \left|\frac{\dot{A}_{2D}}{\dot{A}_{2S}}\right| = \left|\frac{\dot{E}_{2D}}{\dot{B}_2}\Big/\frac{\dot{E}_{2S}}{\dot{B}_2}\right| = \left|\frac{\dot{E}_{2D}}{\dot{E}_{2S}}\right| = \frac{|\dot{E}_{2D}|}{|\dot{E}_{2S}|} \\[4pt] F(\theta_3) = \left|\frac{\dot{A}_{3D}}{\dot{A}_{3S}}\right| = \left|\frac{\dot{E}_{3D}}{\dot{B}_3}\Big/\frac{\dot{E}_{3S}}{\dot{B}_3}\right| = \left|\frac{\dot{E}_{3D}}{\dot{E}_{3S}}\right| = \frac{|\dot{E}_{3D}|}{|\dot{E}_{3S}|} \\[4pt] F(\theta_4) = \left|\frac{\dot{A}_{4D}}{\dot{A}_{4S}}\right| = \left|\frac{\dot{E}_{4D}}{\dot{B}_4}\Big/\frac{\dot{E}_{4S}}{\dot{B}_4}\right| = \left|\frac{\dot{E}_{4D}}{\dot{E}_{4S}}\right| = \frac{|\dot{E}_{4D}|}{|\dot{E}_{4S}|} \\[4pt] F(\theta_5) = \left|\frac{\dot{A}_{5D}}{\dot{A}_{5S}}\right| = \left|\frac{\dot{E}_{5D}}{\dot{B}_5}\Big/\frac{\dot{E}_{5S}}{\dot{B}_5}\right| = \left|\frac{\dot{E}_{5D}}{\dot{E}_{5S}}\right| = \frac{|\dot{E}_{5D}|}{|\dot{E}_{5S}|} \end{array}\right\} \quad (7)$$

While the electric fields $\dot{A}_{1S}$, $\dot{A}_{2S}$, ..., $\dot{A}_{5S}$ are expressed by the received electric fields at the sum signal output terminal 21a divided by the electric radiation fields of the respective antenna elements, the electric fields $\dot{A}_{1D}$, $\dot{A}_{2D}$, ..., $\dot{A}_{5D}$ are expressed by the received electric fields at the difference signal output terminal 21b divided by the electric radiation fields of respective element antennas. Since the electric radiation field of the transmitting phased array antenna contributes equally to the electric fields of the sum and difference patterns, $|\dot{E}_{66}/\dot{E}_\Sigma|$ can be expressed as the ratio of the sum pattern electric field and the difference pattern electric field.

Considering a $\dot{E}_\Delta/\dot{E}_\Sigma$ pattern, it can be seen from the equation (7) that any influence of the electric radiation field of the phased array antenna is cancelled and that $\dot{E}_\Delta/\dot{E}_\Sigma$ can be expressed as a ratio of the received electric field including the electric radiation field of the transmitting antenna and observed at the difference signal output terminal 21b and the received electric field including the electric radiation field of the transmitting antenna and observed at the sum signal output terminal 21a.

Figure 9:
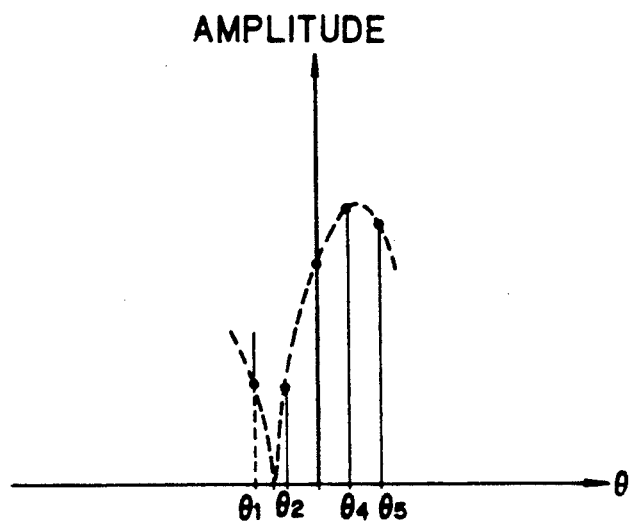

By using the amplitude ratios of the difference signal electric fields and the sum signal electric fields in the respective directions $\theta_1$, $\theta_2$, $\theta_3$, $\theta_4$, $\theta_5$ as acquired in the equation (7) and effecting interpolation processing, the null angle in the difference signal vs. sum signal pattern can be obtained as shown in FIG. 9.

An operation for acquiring the null angle in the difference pattern will next be explained.

In this instance, it is necessary to obtain in advance relative values of $\dot{B}_1$, $\dot{B}_2$, ..., $\dot{B}_5$ in the equation (1) by executing the initial calibration as described below.

Figure 10:
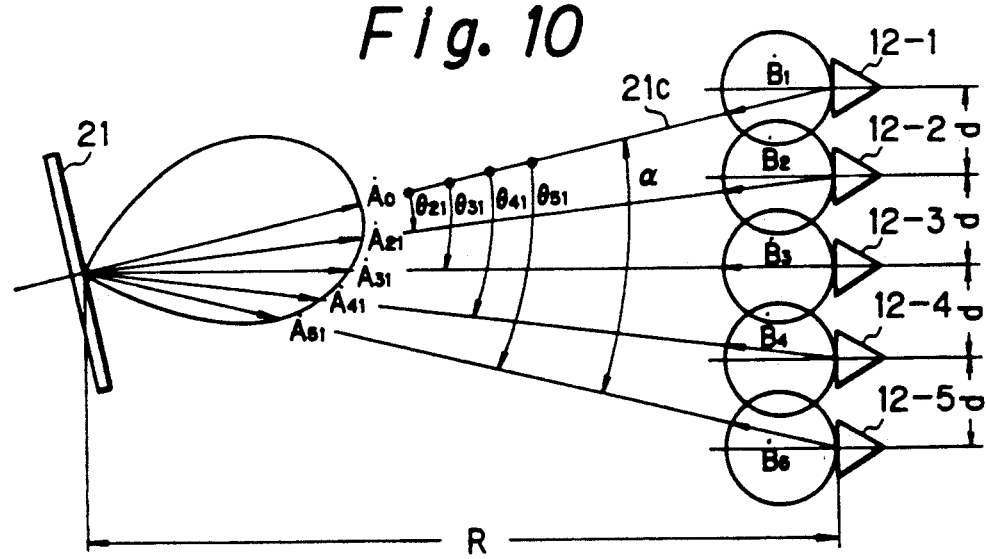

Firstly, the positioner 23 is so set that an axis offset by a given angle from the mechanical boresight axis 21c of the monopulse antenna 21 is oriented toward the antenna element 12-1. For the convenience of explanation, it is assumed here that the offset angle is set to zero as shown in FIG. 10, that is, the mechanical boresight axis 21c passes the first antenna element 12-1.

Under this condition, the composite electric power transmitted by the phased array antenna 11 is measured at the sum signal output terminal 21a of the monopulse antenna 21. Then, by applying the rotating element electrical field vector method as described above, the received electric field vectors $\dot{E}_{1S1}, \dot{E}_{2S1}, \ldots, \dot{E}_{5S1}$ corresponding to the respective antenna elements may be individually obtained. When the electric fields in the sum pattern in the directions of the respective antenna elements 12-1, ..., 12-5 are equal to $\dot{A}_0, \dot{A}_{21}, \ldots, \dot{A}_{51}$ as shown in FIG. 10, the following equations are obtained:

$$\left.\begin{array}{l} \dot{E}_{1S1} = \dot{A}_0 \dot{B}_1 \\ \dot{E}_{2S1} = \dot{A}_{21} \dot{B}_2 \\ \dot{E}_{3S1} = \dot{A}_{31} \dot{B}_3 \\ \dot{E}_{4S1} = \dot{A}_{41} \dot{B}_4 \\ \dot{E}_{5S1} = \dot{A}_{51} \dot{B}_5 \end{array}\right\} \quad (8)$$

Figure 11:
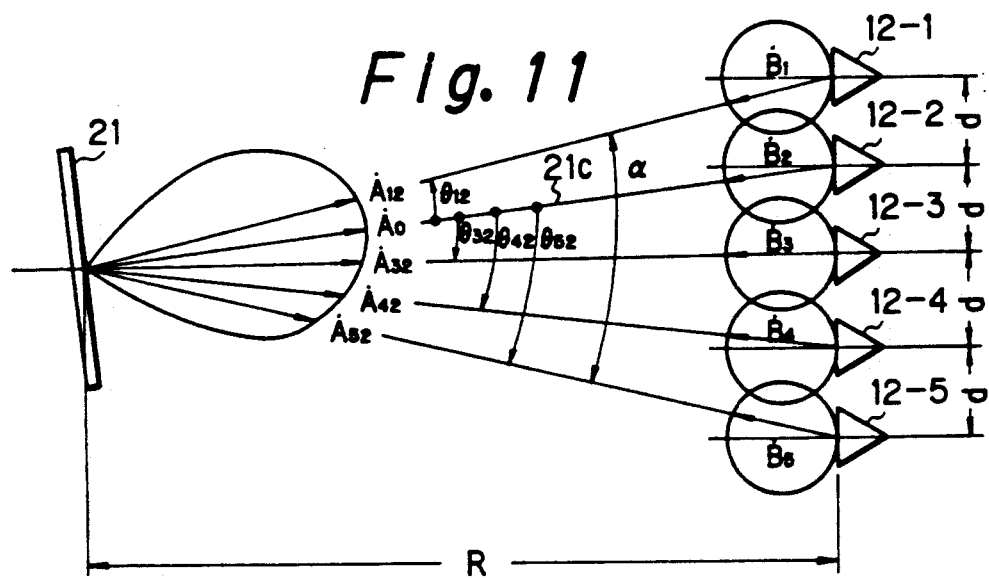

Then, as shown in FIG. 11, the positioner 23 is so set that the mechanical boresight axis 21c of the monopulse antenna passes the second antenna element 12-2.

When the electric fields in the sum pattern in the directions of the respective antenna elements are equal to $\dot{A}_{12}, \dot{A}_0, \dot{A}_{32}, \dot{A}_{42}, \dot{A}_{52}$ under this condition, measurement and operational processing made in the same manner as described above enable the received electric field vectors $\dot{E}_{1S2}, \dot{E}_{2S2}, \ldots, \dot{E}_{5S2}$ corresponding to the respective antenna elements to be acquired as expressed in the following equation:

$$\left.\begin{array}{l} \dot{E}_{1S2} = \dot{A}_{12} \dot{B}_1 \\ \dot{E}_{2S2} = \dot{A}_0 \dot{B}_2 \\ \dot{E}_{3S2} = \dot{A}_{32} \dot{B}_3 \\ \dot{E}_{4S2} = \dot{A}_{42} \dot{B}_4 \\ \dot{E}_{5S2} = \dot{A}_{52} \dot{B}_5 \end{array}\right\} \quad (9)$$

Figure 12:
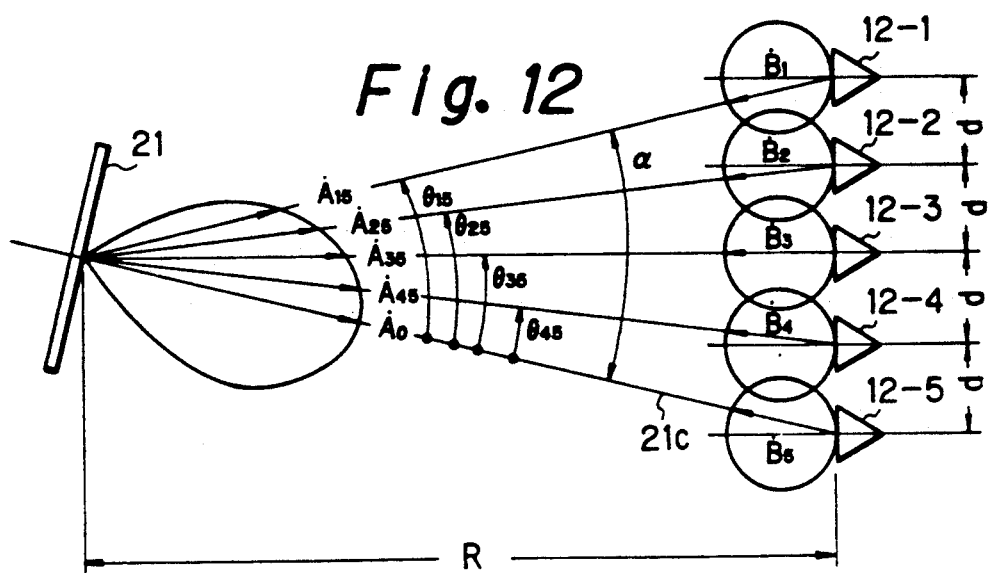

In the same manner as described above, the rotator 23 is so set that the boresight axis 21c of the monopulse antenna sequentially passes the third, fourth and fifth antenna elements. When the mechanical boresight axis 21c of the monopulse antenna 21 passes the fifth antenna element 12-5, as shown in FIG. 12, the following equations are obtained:

$$\left.\begin{array}{l} \dot{E}_{1S5} = \dot{A}_{15} \dot{B}_1 \\ \dot{E}_{2S5} = \dot{A}_{25} \dot{B}_2 \\ \dot{E}_{3S5} = \dot{A}_{35} \dot{B}_3 \\ \dot{E}_{4S5} = \dot{A}_{45} \dot{B}_4 \\ \dot{E}_{5S5} = \dot{A}_0 \dot{B}_5 \end{array}\right\} \quad (10)$$

As understood above, similar steps are repeated, for example, five times or at the frequency equivalent to the number of the antenna elements constituting the phased array antenna.

Assuming the number of the antenna elements of the phased array antenna is n, it is necessary to obtain values of a plurality number n of unknown quantities $\dot{B}_1, \dot{B}_{B2}, \ldots, \dot{B}_n$, a plurality number $n(n-1)$ of unknown quantities $\dot{A}_{21}, \dot{A}_{31}, \ldots, \dot{A}_{n1}, \dot{A}_{12}, \dot{A}_{32}, \ldots, \dot{A}_{2n}, \ldots, \dot{A}_{1n}, \dot{A}_{2n}, \ldots, \dot{A}_{(n-1)n}$ and one unknown quantity $A_0$. That is, $n + n(n-1) + 1 = n^2 + 1$ unknown quantities must be acquired. On the other hand, the simultaneous equations obtained by the measurements are $n^2$-dimensional.

Accordingly, the relative values of the remaining electric field vectors can be obtained with reference to any one of the electric field vectors of the antenna elements. Assuming the electric field vector $\dot{B}_1$ to be a reference, the following normalization vectors can be obtained:

$$\left.\begin{array}{l} \dot{b}_1 = \dot{B}_1/\dot{B}_1 = 1 \\ \dot{b}_2 = \dot{B}_2/\dot{B}_1 \\ \dot{b}_3 = \dot{B}_3/\dot{B}_1 \\ \dot{b}_4 = \dot{B}_4/\dot{B}_1 \\ \dot{b}_5 = \dot{B}_5/\dot{B}_1 \end{array}\right\} \quad (11)$$

These vectors are stored in the signal processor 25 as initial calibration values.

Next, similar to the case of obtaining the null angle in the difference signal vs. sum signal pattern, the positioner 23 is so set that the null direction in the difference pattern may be included within the angle α as shown in FIG. 4. Then an array pattern composite electric field is measured at the difference signal output terminal 21b, and, by applying the rotating element electrical field vector method, the received electric field vectors $\dot{E}_{1D}, \dot{E}_{2D}, \ldots, \dot{E}_{5D}$ according to the equation (1) are acquired.

What is to be finally acquired is the electric field vectors in the difference pattern of the monopulse antenna 21, or $\dot{A}_{1D}, \dot{A}_{2D}, \ldots, \dot{A}_{5D}$ according to the equation (1). Since $\dot{B}_1, \dot{B}_2, \ldots, \dot{B}_5$ in equation (1) are electric field vectors representing relative values of the radiation electric fields, it is possible that $\dot{B}_1, \dot{B}_2, \ldots, \dot{B}_5$ may be substituted with the normalization vectors $\dot{b}_1, \dot{b}_2, \ldots, \dot{b}_5$ assuming $B_1$ as the reference as expressed by the equation (11) and stored as the calibration values. By executing this substitution, the equation (1) may be rewritten as follows:

$$\left.\begin{array}{l} \dot{E}_{1D} = \dot{A}_{1D} \dot{b}_1 (= \dot{A}_{1D}) \\ \dot{E}_{2D} = \dot{A}_{2D} \dot{b}_2 \\ \dot{E}_{3D} = \dot{A}_{3D} \dot{b}_3 \\ \dot{E}_{4D} = \dot{A}_{4D} \dot{b}_4 \\ \dot{E}_{5D} = \dot{A}_{5D} \dot{b}_5 \end{array}\right\} \quad (12)$$

Since $\dot{E}_{1D}, \dot{E}_{2D}, \ldots, \dot{E}_{5D}$ as well as $\dot{b}_1, \dot{b}_2, \ldots, \dot{b}_5$ in the equation (12) are known, the values of the unknown quantities $\dot{A}_{1D}, \dot{A}_{2D}, \ldots, \dot{A}_{5D}$ may be obtained.

As the amplitude values in the difference pattern of the monopulse antenna 21 in the directions $\theta_1, \theta_2, \theta_3, \theta_4, \theta_5$ (FIG. 4) become known, interpolation processing as shown in FIG. 9 enables the null angle in the difference pattern to be obtained.

The positioner controller 24 causes the rotator 23 to be initially set such that the null angle δ may be included within an angle (corresponding to the angle α in FIG. 4) which views the antenna elements 12-1 and 12-5 at the opposite ends of the phased array antenna from the aperture center of the monopulse antenna 21. Within this range of angle, even if the null angle δ in the difference pattern of the monopulse antenna is varied due to the effect of minute-step beam scanning, the radiation pattern of the monopulse antenna can be measured and the null angle computed by changing amounts of phase shift set in the phase shifters 14-1, 14-2, ..., 14-5 while the positioner 23 held stationary. Furthermore, in order to obtain $b_1, b_2, \ldots, b_5$ in the equation (12) for measuring the null angle in the difference pattern, it is necessary to set the positioner 23 five times in different directions. But such a setting of the positioner 23 may be done once before measurement for calibration is carried out. In addition, as long as the radiation patterns of the respective antenna elements constituting the transmitting array antenna and the sum pattern of the receiving monopulse antenna do not have steep amplitude and phase characteristics within the angular range α, a measurement error attributable to a low degree of accuracy in setting the positioner 23 may be small.

Accordingly, the problems caused by the prior art measurement method, that is, the problem of a low measurement speed due to the necessity of rotating the monopulse antenna so as to change the beam scanning angle and the problem of a low degree of measurement accuracy caused by the difficulty in repeatedly setting the positioner in the same position, may be overcome owing to the fact that the phase shifters 14-1, 14-2, ..., 14-5 can change amounts of phase shift at a high speed and that the amounts of phase set therein may be kept stable. Therefore, an antenna measuring apparatus according to the present invention is suitable for measuring a change in the null angle of an electrically scanning monopulse antenna when such an antenna effects beam scanning at a minute step.

The invention has been described in detail with particular reference to a certain embodiment thereof, but it will be understood that variations and modifications can be effected within the spirit and scope of the invention. In the disclosed embodiment, a linear array antenna having a plurality of equidistantly arranged antenna elements has been employed as a transmitting array antenna and the null angle has been measured when a monopulse antenna has effected beam scanning along the direction of the antenna element.

However, it is to be understood that the null angle of a monopulse antenna may be acquired when the monopulse antenna effects beam scanning in an arbitrary direction, by use of a planar array antenna and by executing two dimensional measurement, operational processing and interpolation.

What is claimed is:

1. A method of measuring an angular direction of null in the difference vs. sum signal pattern of a monopulse antenna, comprising the steps of:

transmitting a predetermined RF signal from an array antenna including a plurality of antenna elements having a predetermined phase relationship to said monopulse antenna;

receiving the RF signal at said monopulse antenna;

acquiring difference and sum signals which said monopulse antenna produces in each direction of the respective antenna elements;

computing a ratio of the difference signal to the sum signal acquired in each of the directions of the respective antenna elements; and obtaining the null angle in the difference vs. sum signal pattern of said monopulse antenna in accordance with computed ratios, wherein said array antenna comprises phase shifters connected respectively to said antenna elements and a controller for causing desired amounts of phase shift to be set in said phase shifters, said steps of transmitting a predetermined RF signal and of acquiring sum and difference signals further including the steps of adjusting the amount of phase shift set in each of said phase shifters in turn from the first to the last phase shifters and transmitting an RF signal from said array antenna each time the amount of phase shift is changed;

receiving the transmitted RF signal at said monopulse antenna and acquiring the difference signal output from said monopulse antenna in each of the directions of said respective antenna elements;

transmitting a second RF signal from said array antenna; and receiving the second RF signal at said monopulse antenna and acquiring the sum signal of said monopulse antenna in each of the directions of said respective antenna elements.

2. A method as claimed in claim 1 wherein said step of acquiring an angular direction of null includes the step of effecting interpolation processing to the computed ratios to acquire a continuous difference vs. sum signal pattern.

3. A method of measuring an angular direction of null in the difference pattern of a monopulse antenna, comprising the steps of:

transmitting an RF signal from an array antenna including a plurality of antenna elements having a predetermined phase relationship to said monopulse antenna;

changing the direction of said monopulse antenna in sequence so that it faces the respective antenna elements;

receiving the RF signal every time the direction of said monopulse antenna is switched;

acquiring values of the radiation electric fields which said respective antenna elements form and the difference signals which said monopulse antenna produces in each direction of said respective antenna elements;

acquiring the ratios of the acquired difference signals to the corresponding radiation electric fields, wherein said step of acquiring the ratios comprises the step of dividing the difference signal in each direction of said respective antenna elements by a corresponding one of the calibration values; and acquiring the null angle in the difference pattern of said monopulse antenna in accordance with the acquired ratios, wherein said step of acquiring the null angle comprises the step of acquiring a continuous signal pattern by effecting interpolation processing of the acquired ratios, wherein the step of acquiring values of the radiation electric fields comprises the steps of acquiring the sum signal which said monopulse antenna produces in each of the directions of said respective antenna elements every time the boresight axis of said monopulse antenna is oriented toward any one of said antenna elements;

acquiring relative values of the radiation electric fields of said respective antenna elements in accordance with the acquired sum signals; and storing the relative values for calibration.

4. An apparatus for measuring an angular direction of null in a radiation pattern of a monopulse antenna, comprising:

means connected to said monopulse antenna for changing the direction of said monopulse antenna;

a transmitting phased array antenna facing said monopulse antenna and including a plurality of antenna elements, a like plurality of phase shifters each connected to a respective one of said antenna elements, and a controller for causing respective desired amounts of phase shift to be set in the respective phase shifters, said transmitting antenna being capable of radiating a test signal, said antenna elements being capable of changing the phase of signals passing therethrough;

a signal processor means receiving the sum signal and the difference signal from said monopulse antenna to acquire the null angle by processing these sum and difference signals, and means intercoupling said means for changing and said signal processor means for controlling the phase shift determined by said controller based on the direction determined by said means for changing.

5. An apparatus as claimed in claim 4 wherein the monopulse antenna has a beam scanning direction and a boresight axis, and said plurality of antenna elements are linearly arranged at an equal distance along the beam scanning direction of the monopulse antenna with a centrally located said antenna element being located on the boresight axis of the monopulse antenna.

6. An apparatus as claimed in claim 5 wherein said means for changing the direction of said monopulse antenna is a rotator adapted to mechanically rotate said monopulse antenna along the direction in which said antenna elements are arranged.

7. An apparatus as claimed in claim 4 wherein said plurality of antenna elements are arranged in a plane.

8. An apparatus as claimed in claim 4 wherein said monopulse antenna is capable of electrically scanning a beam.

9. An apparatus as claimed in claim 4 wherein said signal processor means comprises:

means for acquiring the ratios of the acquired difference signals to the corresponding acquired sum signals; and means for effecting interpolation processing of the acquired ratios to acquire a continuous difference vs. sum signal pattern.

10. An apparatus as claimed in claim 4 wherein said signal processor means comprises:

means for acquiring the ratios of the acquired difference signals to the corresponding radiation electric fields; and means for acquiring a continuous signal pattern by effecting interpolation processing of the acquired ratios.

11. A method as claimed in claim 1 wherein:

said step of acquiring sum and difference signals further comprises the step of acquiring values of the radiation fields which said respective antenna elements form; and said method further comprises the step of acquiring the null angle in the radiation pattern of said monopulse antenna, comprising acquiring the ratios of the acquired difference signals to the corresponding radiation electric fields.

12. A method as claimed in claim 3 wherein:

said step of acquiring values further comprises the step of acquiring sum signals which said monopulse antenna produces in each direction of said respective antenna elements; and said method further comprises the step of acquiring the null angle in the radiation pattern of said monopulse antenna in accordance with the acquired sum and difference signals.

13. A method of measuring an angular direction of null in a radiation pattern of a monopulse antenna, comprising the steps of:

transmitting a predetermined RF signal from an array antenna including a plurality of antenna elements having a predetermined phase relationship to said monopulse antenna;

receiving the RF signal at said monopulse antenna;

acquiring sum and difference signals which said monopulse antenna produces in each direction of the respective antenna elements; and acquiring the null angle in the radiation pattern of said monopulse antenna in accordance with the acquired sum and difference signals, comprising acquiring the ratios of the acquired difference signals to the corresponding sum signals wherein said step of acquiring the null angle further comprises acquiring a continuous signal pattern by effecting interpolation processing of the acquired ratios.

14. A method as claimed in claim 13 wherein:

said method further comprises, after said transmitting step, changing the direction of said monopulse antenna in sequence so that it faces the respective antenna elements; and said receiving step comprises receiving the RF signal at said monopulse antenna every time that said changing step is performed.

15. A method of measuring an angular direction of null in a radiation pattern of a monopulse antenna, comprising the steps of:

transmitting a predetermined RF signal from an array antenna including a plurality of antenna elements having a predetermined phase relationship to said monopulse antenna;

receiving the RF signal at said monopulse antenna;

acquiring values of the radiation electric fields which said respective antenna elements form and the difference signals which said monopulse antenna produces in each direction of the respective antenna elements; and acquiring the null angle in the radiation pattern of said monopulse antenna in accordance with the acquired field values and difference signals, comprising acquiring the ratios of the acquired difference signals to the corresponding radiation electric fields wherein said step of acquiring the null angle further comprises acquiring a continuous signal pattern by effecting interpolation processing of the acquired ratios.

16. A method as claimed in claim 15 wherein:

said method further comprises, after said transmitting step, changing the direction of said monopulse antenna in sequence so that it faces the respective antenna elements; and said receiving step comprises receiving the RF signal at said monopulse antenna every time that said changing step is performed.

17. A method as claimed in claim 16 wherein the step of acquiring values of the radiation electric fields comprises the steps of:

acquiring the sum signal which said monopulse antenna produces in each of the directions of said respective antenna elements every time the boresight axis of said monopulse antenna is oriented toward any one of said antenna elements;

acquiring relative values of the radiation electric fields of said respective antenna elements in accordance with the acquired sum signals; and storing the relative values for calibration.

18. A method as claimed in claim 17 wherein said step of acquiring the ratios comprises the step of dividing the difference signal in each direction of said respective antenna elements by a corresponding one of the calibration values.

* * * * *